(12) United States Patent
Masnaghetti et al.

(10) Patent No.: US 10,325,753 B2
(45) Date of Patent: Jun. 18, 2019

(54) METHOD AND SYSTEM FOR FOCUS ADJUSTMENT OF A MULTI-BEAM SCANNING ELECTRON MICROSCOPY SYSTEM

(71) Applicant: KLA-Tencor Corporation, Milpitas, CA (US)

(72) Inventors: Doug K. Masnaghetti, San Jose, CA (US); Richard R. Simmons, Los Altos, CA (US); Scott A. Young, Soquel, CA (US); Mark A. McCord, Los Gatos, CA (US); Rainer Knippelmeyer, Groton, MA (US)

(73) Assignee: KLA Tencor Corporation, Milpitas, CA (US)

( * ) Notice: Subject to any disclaimer, the term of this patent is extended or adjusted under 35 U.S.C. 154(b) by 0 days.

(21) Appl. No.: 15/272,194

(22) Filed: Sep. 21, 2016

(65) Prior Publication Data

US 2017/0084424 A1    Mar. 23, 2017

Related U.S. Application Data

(60) Provisional application No. 62/222,325, filed on Sep. 23, 2015.

(51) Int. Cl.
*H01J 37/153* (2006.01)
*H01J 37/21* (2006.01)
*H01J 37/28* (2006.01)

(52) U.S. Cl.
CPC ............ *H01J 37/153* (2013.01); *H01J 37/21* (2013.01); *H01J 37/28* (2013.01); *H01J 2237/12* (2013.01); *H01J 2237/1532* (2013.01); *H01J 2237/216* (2013.01); *H01J 2237/221* (2013.01)

(58) Field of Classification Search
USPC .......................................... 250/310, 307, 311
See application file for complete search history.

(56) References Cited

U.S. PATENT DOCUMENTS

| | | | | |
|---|---|---|---|---|
| 5,430,292 A * | 7/1995 | Honjo | ...................... | G03F 1/86 250/310 |
| 6,521,891 B1 * | 2/2003 | Dotan | ..................... | H01J 37/21 250/307 |
| 6,566,664 B2 * | 5/2003 | Muraki | ................... | B82Y 10/00 250/492.2 |
| 6,570,156 B1 * | 5/2003 | Tsuneta | ................... | H01J 37/26 250/311 |

(Continued)

*Primary Examiner* — Phillip A Johnston
(74) *Attorney, Agent, or Firm* — Suiter Swantz pc llo

(57) ABSTRACT

A scanning electron microscopy system is disclosed. The system includes a multi-beam scanning electron microscopy (SEM) sub-system. The SEM sub-system includes a multi-beam electron source configured to form a plurality of electron beams, a sample stage configured to secure a sample, an electron-optical assembly to direct the electron beams onto a portion of the sample, and a detector assembly configured to simultaneously acquire multiple images of the surface of the sample. The system includes a controller configured to receive the images from the detector assembly, identify a best focus image of images by analyzing one or more image quality parameters of the images, and direct the multi-lens array to adjust a focus of one or more electron beams based on a focus of an electron beam corresponding with the identified best focus image.

14 Claims, 14 Drawing Sheets

(56) References Cited

U.S. PATENT DOCUMENTS

| | | | | |
|---|---|---|---|---|
| 6,784,442 | B2 * | 8/2004 | Muraki | B82Y 10/00 250/396 ML |
| 7,521,676 | B2 * | 4/2009 | Okuda | H01J 37/026 250/306 |
| 8,043,772 | B2 * | 10/2011 | Miwa | G03F 7/70641 382/144 |
| 2001/0052573 | A1 * | 12/2001 | Takakuwa | H01J 37/304 250/398 |
| 2009/0309022 | A1 | 12/2009 | Gunji et al. | |
| 2012/0241606 | A1 | 9/2012 | Han et al. | |
| 2013/0176622 | A1 | 7/2013 | Abrahamsson et al. | |
| 2014/0204183 | A1 | 7/2014 | Lee et al. | |
| 2014/0224985 | A1 | 8/2014 | Rodgers et al. | |

\* cited by examiner

METHOD AND SYSTEM FOR FOCUS ADJUSTMENT OF A MULTI-BEAM SCANNING ELECTRON MICROSCOPY SYSTEM

CROSS-REFERENCE TO RELATED APPLICATION

The present application claims benefit under 35 U.S.C. § 119(e) and constitutes a regular (non-provisional) patent application of U.S. Provisional Application Ser. No. 62/222,325, filed Sep. 23, 2015, entitled TECHNIQUES FOR RAPID FOCUS ADJUSTMENT IN A MULTIPLE-BEAM IMAGING SYSTEM, naming Mark McCord, Rainer Knippelmeyer, Douglas Masnaghetti, Richard Simmons and Scott Young as inventors, which is incorporated herein by reference in the entirety.

TECHNICAL FIELD

The present invention generally relates to scanning electron microscopy, and, in particular, to focus adjustment in a multi-beam electron microscopy system.

BACKGROUND

The fabrication of semiconductor devices, such as logic and memory devices, typically includes processing a substrate such as a semiconductor wafer using a large number of semiconductor fabrication processes to form various features and multiple levels of the semiconductor devices. As semiconductor device size become smaller and smaller, it becomes critical to develop enhanced inspection and review devices and procedures. One such inspection technology includes electron beam based inspection systems, such as, scanning electron microscopy (SEM). In a single beam SEM, performing focus adjustments involves taking multiple images at different focus settings, and then choosing the best image (or interpolating between images to find the best focus). Frequently, astigmatism correction is also adjusted, which can further increase the number of images required. The time to acquire images can be relatively long, which reduces availability of the inspection tool. It would be advantageous to provide a multi-beam SEM system and method that cures the shortcomings observed in single beam SEM approaches.

SUMMARY

A multi-beam scanning electron microscopy apparatus with focusing adjustment capabilities is disclosed, in accordance with one or more embodiments of the present disclosure. In one embodiment, the system includes a multi-beam scanning electron microscopy sub-system comprising: a multi-beam electron source configured to form a plurality of electron beams; a sample stage configured to secure a sample; an electron-optical assembly including a set of electron-optical elements configured to direct at least a portion of the plurality of electron beams onto a portion of the sample; and a detector assembly configured to simultaneously acquire a plurality of images of the surface of the sample, each image associated with an electron beam of the plurality of electron beams. In another embodiment, the system 100 includes a controller including one or more processors configured to execute a set of program instructions stored in memory. In another embodiment, the set of program instructions are configured to cause the one or more processors to: receive the plurality of images from the detector assembly; identify at least one of a best focus image or a best astigmatism image of the plurality of images by analyzing one or more image quality parameters of at least some of the images of the plurality of the images; and direct the multi-beam source to adjust at least one of focus or astigmatism of one or more electron beams based on at least one of focus or astigmatism of an electron beam corresponding with at least one of the identified best focus image or the identified best astigmatism image.

In another embodiment, the controller directs the multi-lens array assembly to establish a focus gradient across an image field of the sample, wherein two or more lenses of the multi-lens array focus two or more electron beams of the plurality of electron beams to different foci.

In another embodiment, the controller directs the multi-lens array assembly to establish an astigmatism gradient across an image field of the sample, wherein two or more lenses of the multi-lens array focus two or more electron beams of the plurality of electron beams so as to display different amounts of astigmatism.

A multi-beam scanning electron microscopy apparatus with focusing adjustment capabilities is disclosed, in accordance with one or more embodiments of the present disclosure. In one embodiment, the system includes a multi-beam scanning electron microscopy sub-system comprising: a plurality of multi-beam electron sources configured to form a plurality of electron beams; a sample stage configured to secure a sample; an electron-optical assembly including a set of electron-optical elements configured to direct at least a portion of the plurality of electron beams onto a portion of the sample; and a detector assembly configured to simultaneously acquire a plurality of images of the surface of the sample, each image associated with an electron beam of the plurality of electron beams. In another embodiment, the system includes a controller including one or more processors configured to execute a set of program instructions stored in memory for causing the one or more processors to: receive the plurality of images from the detector assembly; identify at least one of a best focus image or a best astigmatism image of the plurality of images by analyzing one or more image quality parameters of at least some of the images of the plurality of the images; and direct one or more electron-optical elements to adjust at least one of focus or astigmatism of one or more electron beams based on at least one of focus or astigmatism of an electron beam corresponding with at least one of the identified best focus image or the identified best astigmatism image.

A multi-beam scanning electron microscopy apparatus with focusing adjustment capabilities is disclosed, in accordance with one or more embodiments of the present disclosure. In one embodiment, the system includes a multi-beam scanning electron microscopy sub-system comprising: a multi-beam electron beam source including an electron gun configured to generate an illumination beam and a multi-lens array assembly configured to split the illumination beam into the plurality of electron beams, wherein the multi-lens array assembly is configured for adjusting focus of one or more lenses of the lens array assembly; a sample stage configured to secure a sample; an electron-optical assembly including a set of electron-optical elements configured to direct at least a portion of the plurality of electron beams onto a portion of the sample; and a detector assembly configured to simultaneously acquire a plurality of images of the surface of the sample, each image associated with an electron beam of the plurality of electron beams. In another embodiment, the system includes a controller including one or more processors configured to execute a set of program instructions stored in memory for causing the one or more processors to: direct the multi-lens array assembly to sweep at least one of the focus or astigmatism of one or more lenses during acquisition of one or more images corresponding with the one or more lenses; receive the one or more images from the detector assembly; identify a point in the one or more images displaying at least one of best focus or best astigmatism by analyzing one or more image quality parameters across the one or more images; and direct the multi-lens array to adjust at least one of focus of one or more electron beams or astigmatism of the one or more electron beams based on at least one of the focus or astigmatism at the point in the one or more images displaying at least one of the identified best focus or the identified best astigmatism.

A multi-beam scanning electron microscopy apparatus for measuring and compensating for drift is disclosed, in accordance with one or more embodiments of the present disclosure. In one embodiment, the system includes a multi-beam scanning electron microscopy sub-system comprising: a multi-beam electron beam source including an electron gun configured to generate an illumination beam and a multi-lens array assembly configured to split the illumination beam into the plurality of electron beams, wherein the multi-lens array assembly is configured for adjusting focus of one or more lenses of the lens array assembly; a sample stage configured to secure a sample; an electron-optical assembly including a set of electron-optical elements configured to direct at least a portion of the plurality of electron beams onto a portion of the sample; and a detector assembly configured to simultaneously acquire a plurality of images of the surface of the sample, each image associated with an electron beam of the plurality of electron beams. In another embodiment, a controller including one or more processors configured to execute a set of program instructions stored in memory for causing the one or more processors to: direct the multi-beam scanning electron microscopy sub-system to acquire a first image in an under-focused condition and an additional image in an over-focused condition; receive the first image acquired in the under-focused condition and the additional image acquired in the over-focused condition from the detector assembly; identify focus drift in a current image by comparing the first image and the additional image to the current image acquired at the current focus; and direct the multi-lens array to adjust a focus of one or more electron beams to compensate for the identified focus drift.

A multi-beam scanning electron microscopy apparatus for focus adjustment is disclosed, in accordance with one or more embodiments of the present disclosure. In one embodiment, the system includes a multi-beam microscopy sub-system to perform a line scan of a plurality of electron beams comprising: a multi-beam electron source configured to form the plurality of electron beams; a sample stage configured to secure a sample; an electron-optical assembly including a set of electron-optical elements configured to direct at least a portion of the plurality of electron beams onto a portion of the sample; and a detector assembly configured to simultaneously acquire a plurality of images of the surface of the sample, each image associated with an electron beam of the plurality of electron beams. In another embodiment, the system includes a controller including one or more processors configured to execute a set of program instructions stored in memory for causing the one or more processors to: receive a plurality of line scans from the detector assembly; identify at least one of a best focus line scan or a best astigmatism line scan of the plurality of line scans by analyzing one or more line scan parameters of at least some of the line scans of the plurality of line scans; and direct the multi-lens source to adjust at least one of focus or astigmatism of one or more electron beams based on at least one of focus or astigmatism of an electron beam corresponding with at least one of the identified best focus line scan or the identified best astigmatism line scan.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings. Referring generally to FIGS. 1 through 12, a system and method for rapid focus adjustments in a multi-beam scanning electron microscopy (SEM) imaging system is described in accordance with the present disclosure.

Embodiments of the present disclosure are directed to providing automatic methods for quickly focusing a multi-beam SEM system. In a multi-beam SEM system, a large number of sub-images (e.g., 2 to 200) may be acquired simultaneously that together form a larger contiguous image. In some embodiments of the present disclosure, multiple sub-images having varying focus and/or astigmatism characteristics are acquired. Based on these images, embodiments of the present disclosure identify optical settings for achieving the best focus and/or least amount of astigmatism in images acquired with the multi-beam SEM system of the present disclosure.

Figure 1A:
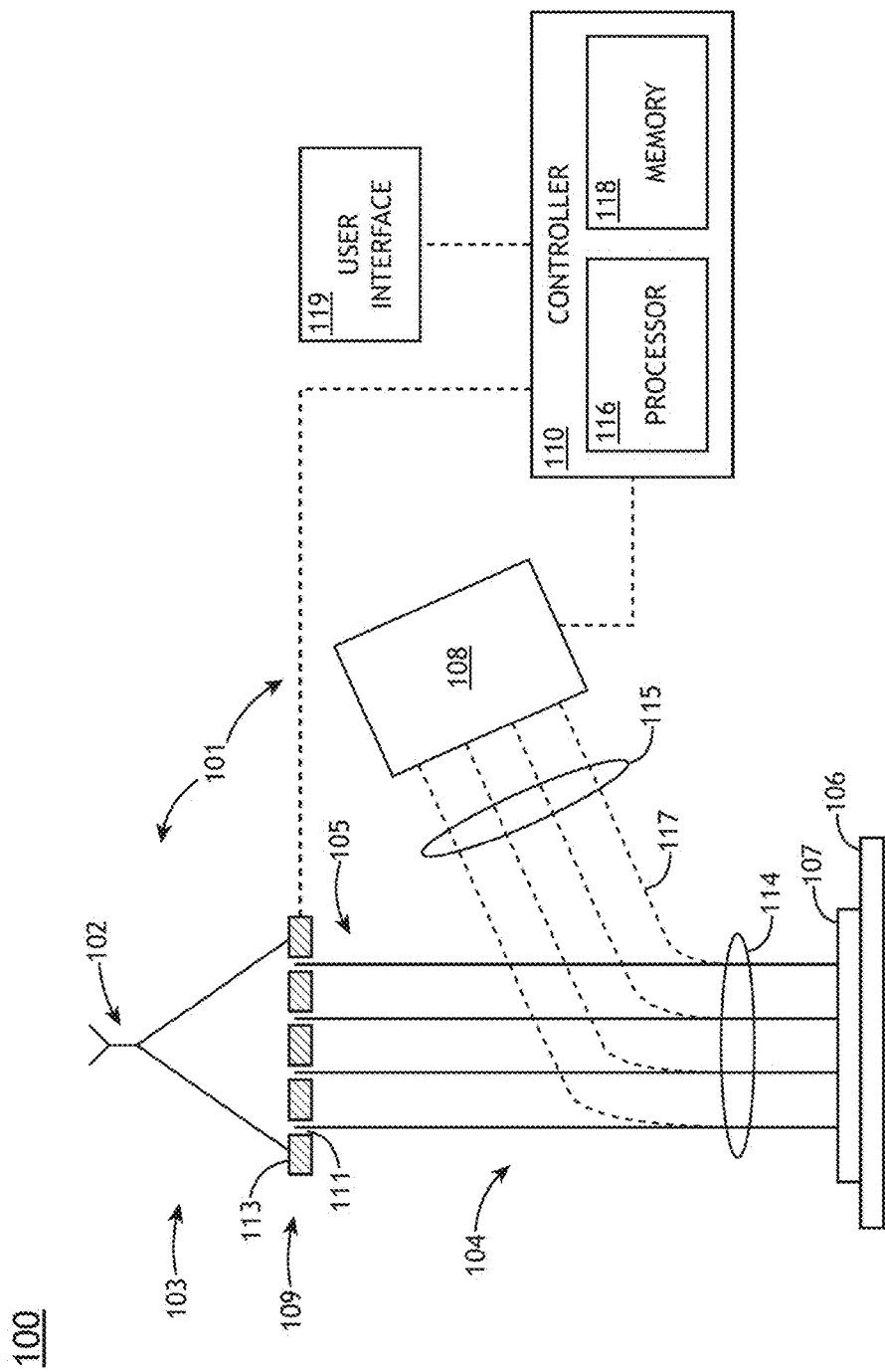
FIG. 1A is a block diagram view of a multi-beam scanning electron microscopy system with focus and astigmatism adjustment capabilities, in accordance with one embodiment of the present disclosure.

FIG. 1A illustrates a system 100 for performing multi-beam SEM imaging, in accordance with one or more embodiments of the present disclosure. In one embodiment, the system 100 includes a multi-beam scanning electron microscopy (SEM) sub-system 101 and a controller 110. The multi-beam SEM sub-system 101 may include any multi-beam SEM sub-system or multi-beam SEM tool known in the art. For example, the multi-beam SEM sub-system 101 may include, but is not limited to, a multi-beam electron beam source 103, an electron-optical assembly 104, a sample stage 106, and a detector assembly 108. In another embodiment, the controller 110 is communicatively coupled to the multi-beam SEM sub-system 101. For example, the controller 110 may be coupled to the output of the detector assembly 108 of the SEM sub-system 101.

In one embodiment, the multi-beam electron source includes an electron gun 102 and a multi-lens array assembly 109 configured to split an initial illumination beam into multiple electron beams 105. For example, the electron gun 102 may include, but is not limited to, a field emission gun (cathode). By way of another example, as shown in FIG. 1, the multi-lens array assembly 109 includes a set of lenses 111 (or "lenslets") in an array plate 113. In this regard, the set of lenses 111 serve to split the initial illumination electron beam into multiple beams 105 (or "beamlets").

In another embodiment, the multi-beam array assembly 109 is adjustable. For example, the multi-beam array assembly 109 is configured to individually adjust and/or control the focus and/or astigmatism of one or more lenses 111 of the lens array assembly 109. In this embodiment, the individual lenses 111 of the set of lenses of the array assembly 109 may focus each beam independently.

In another embodiment, the detector assembly 108 simultaneously acquires multiple images (or "sub-images"). In this regard, each of the electron beams 105 causes a corresponding electron signal (e.g., secondary electron signal or backscattered electron signal) to form a set of signal beams 117. The signal beams 117 then form a set of corresponding images, or sub-images, at the detector assembly 108. The images acquired by the detector assembly 108 are then transmitted to the controller 110 for focus and/or astigmatism analysis. For example, in the case where the SEM sub-system 101 includes N simultaneously operating beams (e.g., 2 to 200 beams), where N corresponding images are simultaneously acquired by the detector assembly 108, the N images can be analyzed to analyze focus and/or astigmatism of one or more of the N images.

The controller 110 may be coupled to the output of the detector assembly 108 in any suitable manner (e.g., by one or more transmission media indicated by the line shown in FIG. 1) such that the controller 110 can receive the output acquired by the detector assembly 108. In one embodiment, the controller 110 includes one or more processors 116 and a memory medium 118 (or memory). The one or more processors 116 are configured to execute a set of program instructions maintained in the memory medium 118 for causing the one or more processors to carry out one or more of the various steps described through the present disclosure.

In one embodiment, the program instructions are configured to cause the one or more processors to utilize information from two or more images acquired by the detector assembly 108 to identify the best focus of SEM sub-system 101. In one embodiment, the program instructions are configured to cause the one or more processors to receive multiple SEM images from the detector assembly 108. It is noted that two or more images of the set of images (e.g., Image1-ImageN) have a different focus condition. As a result, images with different focus conditions (e.g., in focus, over-focused, or under-focused) will display a different level of image sharpness. In another embodiment, the program instructions are configured to cause the one or more processors to identify a best focus image of the set of images by analyzing one or more image quality parameters of at least some of the images (e.g., all of the images or a sub-set of the images) received from the detector assembly 108. For example, the one or more processors may identify a best focus image of the Images1-ImagesN by determining image sharpness for each of the Images 1-Images N received by the controller 110. Then, the one or more processors 116 may identify the image(s) displaying the best image sharpness as the image having the so called "best focus." It is noted that any image analysis technique known in the art to determine image sharpness may be used by the various embodiments of the present disclosure. In another embodiment, once a best focus image is identified, the controller 110 may then adjust one or more lenses 111 of the multi-lens array 113 so to match the focus settings of the lens(es) used to form the best focus image.

It is noted that, while the present disclosure focuses on a SEM sub-system 101 that generates multiple electron beams using an electron gun and multi-lens array, this configuration should not be interpreted as a limitation on the scope of the present disclosure. It is recognized herein that multi-beam sub-system 101 may generate multiple electron beams in any manner known in the art.

Figure 1B:
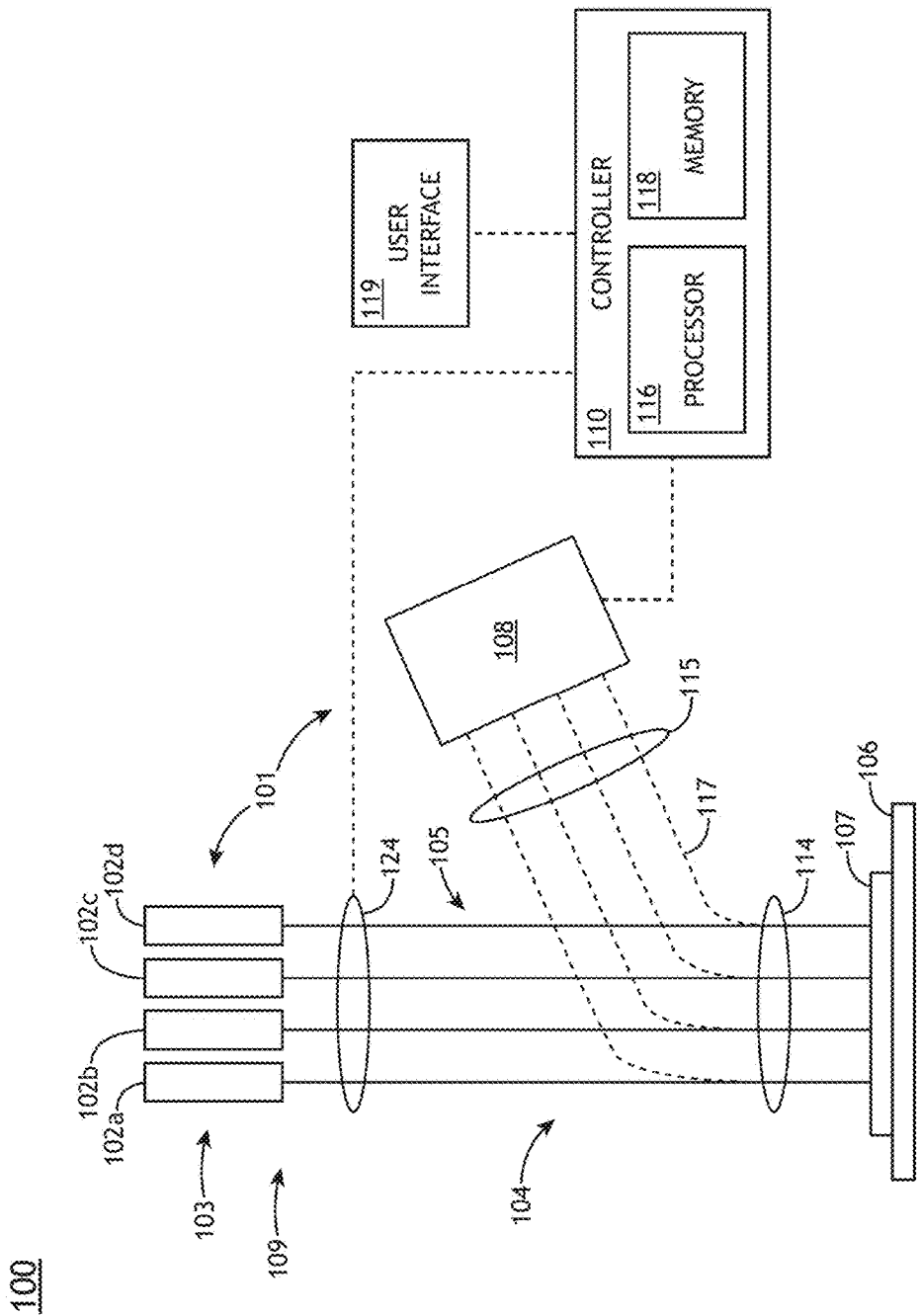
FIG. 1B is a block diagram view of a multi-beam scanning electron microscopy system with focus and astigmatism adjustment capabilities, in accordance with one embodiment of the present disclosure.

For example, as shown in FIG. 1B, the multi-beam source 103 may include a set of individual electron sources 102a-102d (e.g., set of electron guns) to form an electron source array. Further, although not shown, each channel of the system 100 may include an extraction electrode and a lens electrode to form each of the multiple beams 105. In addition, one or more electron-optical elements of the electron-optical assembly 104 may serve to adjust/control the focus of one or more of the electron beams 105. For instance, a condenser lens 124 of the electron-optical assembly 104 may serve to adjust/control the focus of one or more of the electron beams 105 in response to controller 110. For purposes of simplicity, the remainder of the present disclosure focuses on the generation of multiple electron beams using the multi-lens source of FIG. 1A, however, it is noted that any of the embodiments described throughout the present disclosure may be extended to the multi-beam source of FIG. 1B and variations thereof.

Figure 2:
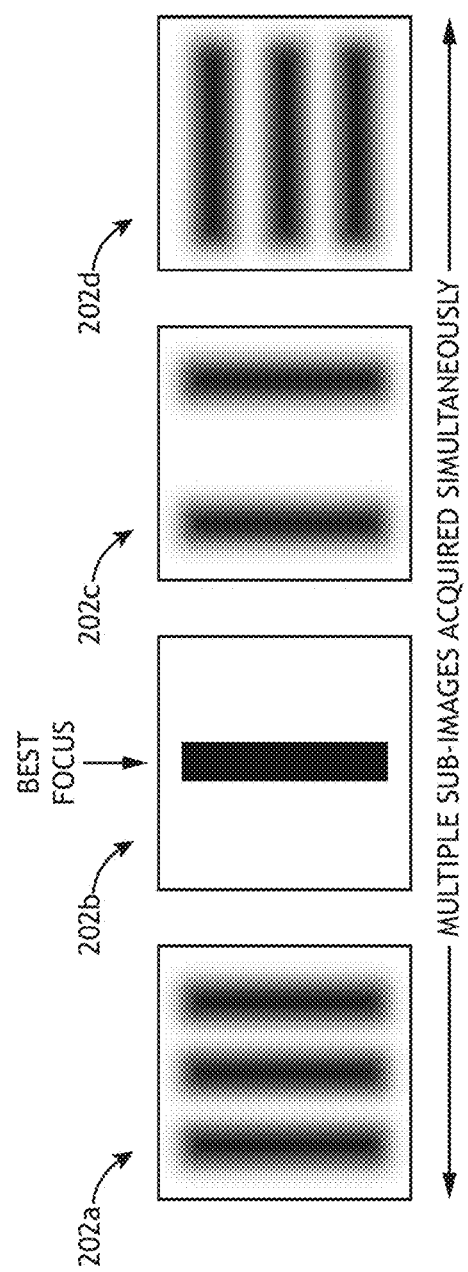
FIG. 2 is conceptual view of a set of SEM images having different focus, in accordance with one embodiment of the present disclosure.

FIG. 2 illustrates a conceptual view of a series of images 202a-202d acquired simultaneously with the multi-beam SEM sub-system 101, in accordance with one or more embodiments of the present disclosure. As shown in FIG. 2, focus varies across the simultaneously acquired images

202a, 202b, 202c and 202d. In the example depicted in FIG. 2, image 202b displays the best image sharpness and, thus, the best focus. After the controller identifies image 202b as the best focus image, the controller 110 may then adjust the focus settings of the lenses 111 of the multi-beam lens array 113 so as to match the focus setting of the lens used to form image 202b. It is noted that the focus variation may be imparted to the field and, thus, the image naturally or intentionally, as discussed in more detail further herein.

It is noted that in some instances one or more images acquired by the detector assembly 108 lack sufficient structural features to analyze image sharpness in the particular image. In one embodiment, prior to identifying best focus of the set of images from the detector assembly 108, the controller 110 may ignore one or more images that lack sufficient structural features for determining focus of the one or more images. In such cases, images containing insufficient structural features for proper image sharpness analysis, these images may be disregarded or ignored for the purposes of identifying the best focus image.

Figure 3:
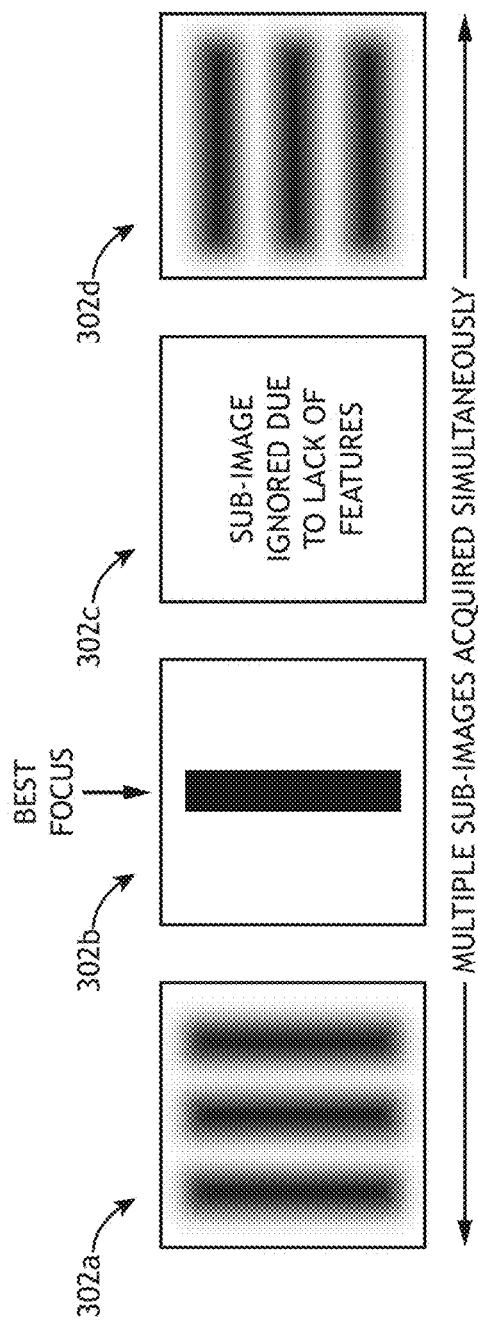
FIG. 3 is conceptual view of a set of SEM images with one or more images disregarded due to the lack of structural features, in accordance with one embodiment of the present disclosure.

In one embodiment, the program instructions are configured to cause the one or more processors to ignore or disregard one or more images acquired by detector assembly 108. FIG. 3 illustrates a conceptual view of a series of images 302a-302d acquired simultaneously with the multi-beam SEM sub-system 101, in accordance with one or more embodiments of the present disclosure. It is noted that image 302c depicts a portion of the sample 107 that lacks sufficient structural detail to analyze image sharpness/focus quality of the image. In one embodiment, images that lack sufficient structural detail for image sharpness/focus quality may be disregarded or ignored by the controller 110. In this regard, the controller 110 may carry out the best focus determination described above without images, such as image 302c, that are blank or contain insufficient structural features.

It is noted that focusing a single beam SEM often requires moving to specific focus targets because a single image may not contain enough features to allow reliable focusing. However, in the multi-beam SEM system 100 of the present disclosure, the controller 101 may ignore sub-images that are blank or lack sufficient image features. It is further noted that due to the large number of sub-images, it is unlikely that all or even most of the sub-images would lack some features for focus. As a result, in many cases, separate focus targets would become unnecessary.

It is noted that, while the embodiments described above have focused on the identification of the best focus condition for the multi-beam SEM sub-system 101, this should not be interpreted as a limitation on the scope of the present disclosure. For example, analogous techniques may be applied by the various embodiments of the present disclosure to determine the lens configuration to achieve minimal astigmatism.

It is noted herein that the focus and/or astigmatism variation across the set of sub-images acquired with the detector assembly 108 may be established through any suitable mechanism.

In one embodiment, the program instructions are configured to cause the one or more processors to utilize natural occurring focus and/or astigmatism variation in determining the best focus of SEM sub-system 101. In some embodiments, the focus variation across the sample 107 (and thus the images acquired by the detectors 108) may be established by naturally occurring focus variation. For example, naturally occurring focus variation may be caused by field curvature aberration. For instance, field curvature aberration may impart focus variation among the sub-images acquired by detector assembly 108. In this example, the controller 110 may analyze the sub-images Image1-ImageN so as to identify the image with the best focus and, thus, the focus condition leading to the best focus without intentionally introducing a focus gradient.

It is noted that such image variation would need to be small enough to not noticeably degrade the performance of the SEM system 100. In a given image field, it is further noted that field curvature typically results in the outer sub-images being over-focused, while the center sub-images are under-focused. In this case, in some embodiments, the best overall focus may be obtained by selecting a focus that is intermediate between the best focus for inner sub-images and the best focus for outer sub-images. This technique has the additional advantage of being able to be performed on actual user images, not necessary requiring separate special images for identifying best focus.

It is further noted that system 100 may take advantage of naturally occurring astigmatism. For example, naturally occurring astigmatism variation may be caused by off-axis astigmatism aberration. For instance, off-axis astigmatism aberration may impart astigmatism variation among the sub-images acquired by detector assembly 108. In this example, the controller 110 may analyze the sub-images Image1-ImageN so as to identify the image with the least amount of astigmatism and, thus, the lens condition leading to the least amount of astigmatism.

It is noted that for the purposes of the present disclosure the term "naturally occurring focus variation" is interpreted to mean variation in focus that occurs without intentional variation in focus caused by the system 100 or a user. Similarly, the term "naturally occurring focus variation" is interpreted to mean variation in astigmatism that occurs without intentional variation in astigmatism caused by the system 100 or a user.

Referring again to FIG. 1A, in another embodiment, the program instructions are configured to cause the one or more processors to utilize intentionally occurring focus and/or astigmatism variation in determining the best focus of SEM sub-system 101.

In one embodiment, the multi-lens array assembly 109 may introduce a focus and/or astigmatism gradient across the image field of the sample 107. In this regard, the controller 110 may direct the multi-lens array assembly to establish a focus and/or astigmatism gradient across an image field of the sample 107.

In another embodiment, after establishing a focus and/or astigmatism gradient across the image field of the sample, a large number of sub-images (e.g., 2 to 200 sub-images) may be acquired simultaneously, whereby each (or at least some) of the sub-images are acquired by the detector assembly 108 at different foci and/or different astigmatism. In turn, each of the acquired sub-images may be analyzed by controller 110 for image sharpness (or other focus indicator) to find the best focus setting and/or best astigmatism setting.

In another embodiment, once a best focus and/or astigmatism setting is identified, the controller 110 may then direct the multi-lens array assembly 109 to adjust a focus and/or astigmatism of one or more electron beams 105 based on the focus of an electron beam corresponding with the identified best focus image.

Figure 4A:
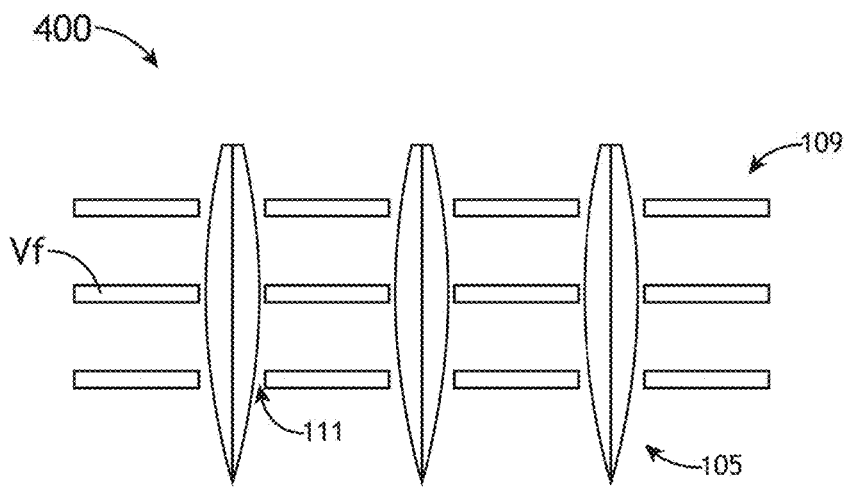
FIGS. 4A-4D are simplified schematic illustrations of the application of a focus gradient across at least one dimension of a sample, in accordance with one embodiment of the present disclosure.

FIGS. 4A-4D illustrate a variety of configurations for inducing a focus gradient across the image field of the sample 107, in accordance with one or more embodiments of the present disclosure. FIG. 4A depicts a nominal configuration 400, whereby the multi-lens array assembly 109 does not impart a focus and/or astigmatism gradient to the electron beams 105.

Figure 4B:
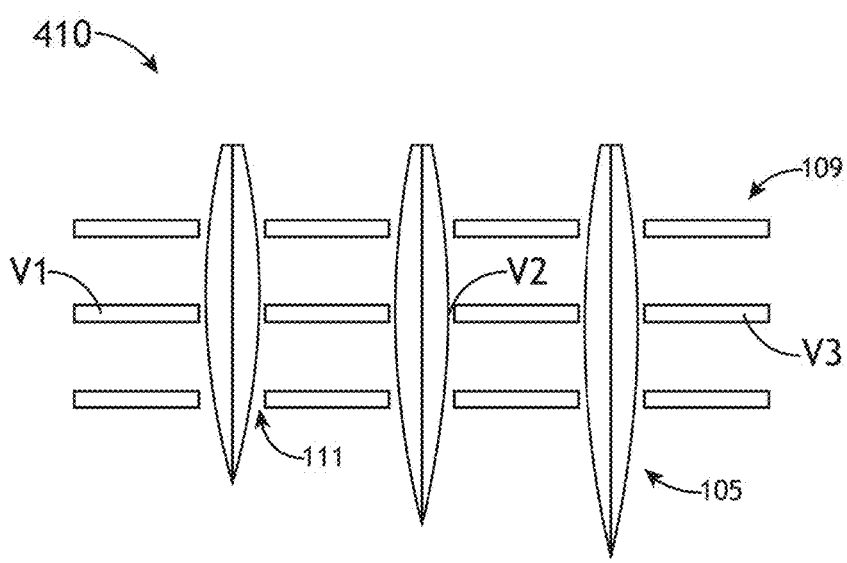

In one embodiment, as shown in view 410 of FIG. 4B, the multi-lens assembly 109 may vary the focus across an image field by varying the voltages across the set of lenses 111 of the multi-lens assembly 109 in one or more directions. It is noted that by varying the voltages of the various lenses 111 across the multi-lens assembly 109 the strength of each lens may be varied in a corresponding fashion. In this regard, a focus gradient may be established across the multi-lens assembly 109, as shown in FIG. 4B.

Figure 4D:
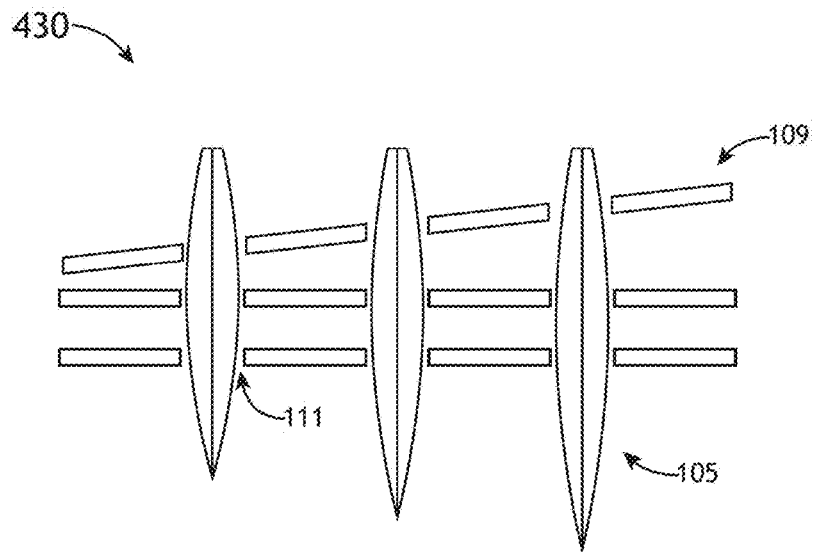
Figure 4C:
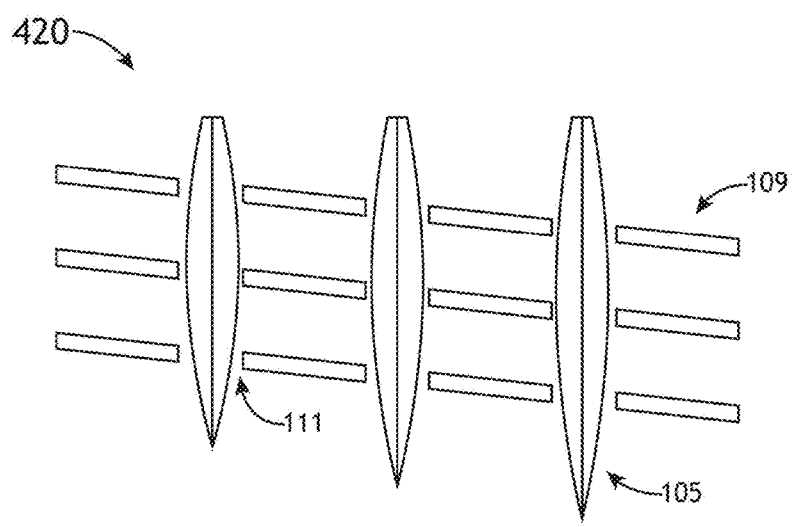

In another embodiment, as shown in view 420 of FIG. 4C, the multi-lens assembly 109 may vary the focus across an image field by mechanically varying the gaps in the plates of the lenses 111 across the multi-lens array 109. It is noted that by varying the plate gap in the various lenses 111 across the multi-lens assembly 109 the strength of each lens may be varied in a corresponding fashion. In this regard, a focus gradient may be established across the multi-lens assembly 109, as shown in FIG. 4C.

In another embodiment, as shown in view 430 of FIG. 4D, the multi-lens assembly 109 may vary the focus across an image field by mechanically tilting the multi-lens array 109. It is noted that by varying tilt of the multi-lens assembly 109 the focus of each beam 105 may be varied in a corresponding fashion. In this regard, a focus gradient may be established across the multi-lens assembly 109, as shown in FIG. 4D.

In one embodiment, the change in voltage, lens gap, and tilt is temporary. In this regard, the changes may be imparted temporarily in order for the detector assembly 108 to acquire multiple SEM images at different focus and transmit the image results to controller 110. Then, once the controller 110 has identified the best focus condition, the controller 110 may then direct the multi-lens assembly 109 to adjust all or at least some of the lenses to match the focus setting of the best focus image.

While for purposes of simplicity the imparted focus variations have been shown only in one dimension in FIGS. 4B-4D, it is noted herein that such a configuration is not a limitation on the scope of the present disclosure. For example, focus may vary as a function of lens position in two dimensions (e.g., X- and Y-positions).

It is further noted that while FIGS. 4A-4D have been described in the context of varying focus across the multi-lens assembly 109, it recognized herein that system 100 may establish an astigmatism gradient across the image field such that each sub-image has a slightly different amount of astigmatism.

Referring again to FIG. 1A, in another embodiment, the program instructions are configured to cause the one or more processors to utilize focus and/or astigmatism sweeping across a single image in determining the best focus of SEM sub-system 101. In one embodiment, focus and/or astigmatism may be varied during the acquisition of a single image frame, and the point in the image frame that has best focus is used to determine the best focus setting.

Figure 5:
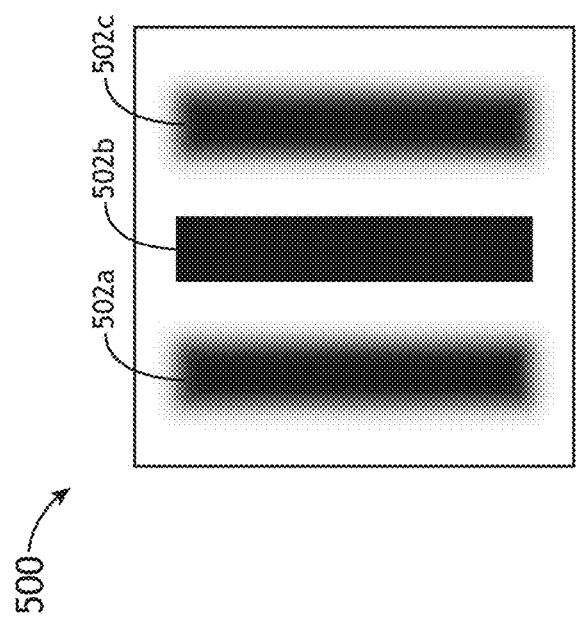
FIG. 5 is conceptual view of an SEM image that was swept in focus during image acquisition, in accordance with one embodiment of the present disclosure.

In this regard, rather than induce a focus (or astigmatism) gradient spatially across an image field, the variation can be induced temporally. For instance, as one or more images are being acquired, the multi-lens assembly 109 may sweep the focus (e.g., swept from under-focused to over-focused) and/or astigmatism during acquisition of one or more images. Then, the controller 110 may analyze at what point in the one or more images the features are sharpest. Based on this analysis the best focus setting can be determined. It is noted that such an approach is more likely to succeed in a multi-beam SEM because the larger number of images will provide greater image information and are less likely to have gaps where no image information is available. FIG. 5 depicts a conceptual view 500 of a single image (of a set of images) acquired by detector assembly 108, which was acquired while sweeping the focus from an under-focused condition to an over-focused condition. For example, image feature 502a was acquired in an under-focused condition, while image feature 502c was acquired in an over-focused condition. Image feature 502b was acquired in an intermediate focus condition, which corresponds to the best available focus. It is noted herein that the accuracy in determining the best focus in this embodiment improves with a higher number of resolvable structural features.

Referring again to FIG. 1A, in another embodiment, the program instructions are configured to cause the one or more processors to track a drift of a best focus condition. In one embodiment, the multi-lens assembly 109 and detector assembly 108 may periodically acquire images at a slightly under-focused condition, alternated with a slightly over-focused condition. Then, the controller 110 may analyze the images to track a slow drift in the best focus condition.

Figure 6:
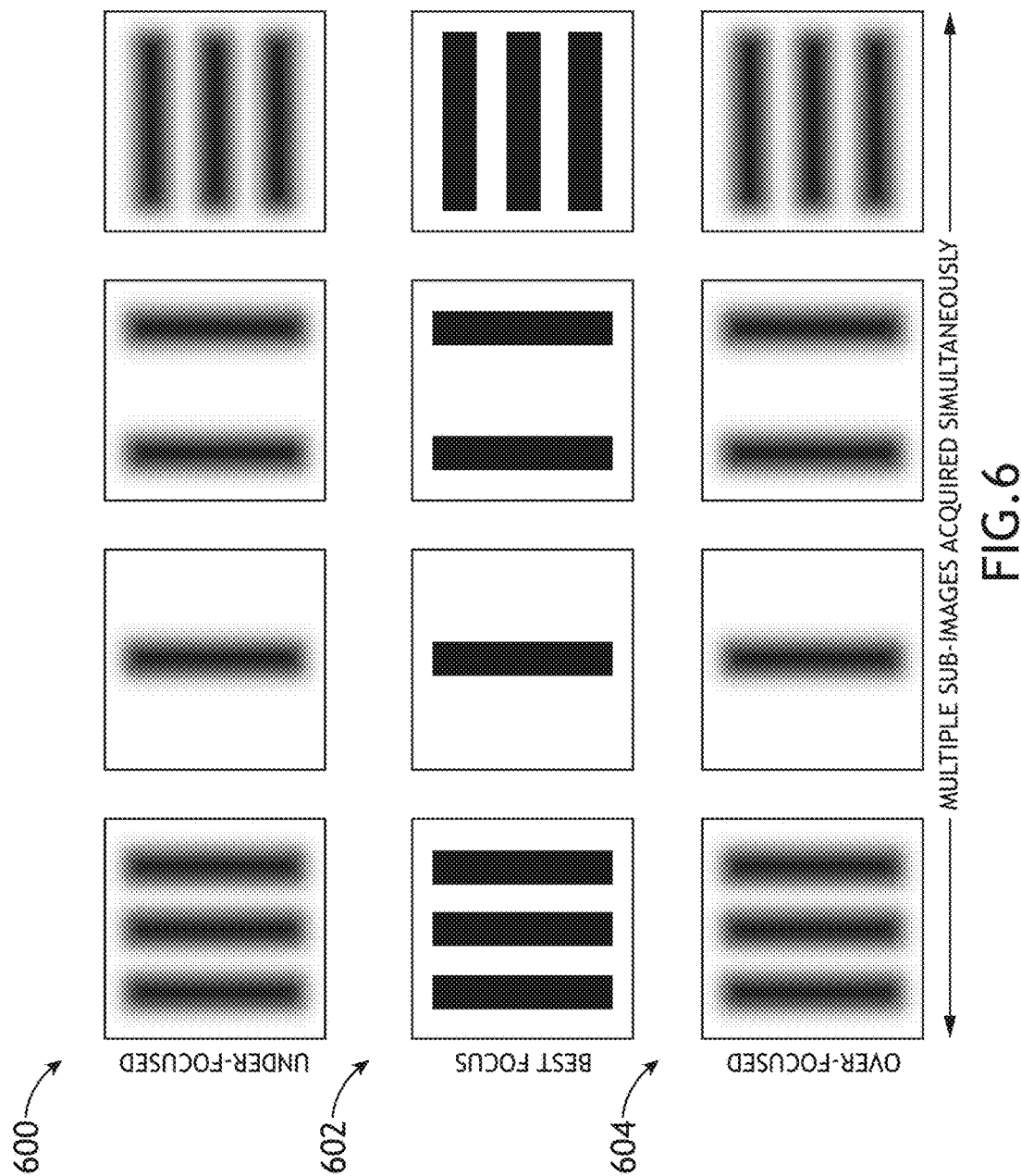
FIG. 6 is conceptual view of a set of SEM images used to analyze focus drift in a multi-beam SEM system, in accordance with one embodiment of the present disclosure.

In a review or inspection application where many images are acquired on a relatively flat sample, it may not be necessary to focus every image. In some embodiments, focus may be characterized over time as a slow drift (e.g., drift due to charging, thermal drifts, sample tilt, and the like) that only needs to be periodically corrected. In this case, the SEM sub-system 101 may periodically acquire a first image (or images) that is over-focused, alternated by periodically acquiring a second image (or images) that is under-focused. By comparing the under-focused image to the over-focused image, the controller 110 can determine if the focus is drifting, and in which direction and by how much, and make appropriate corrections. FIG. 6 illustrates a set of image features that are acquired in an under-focused condition 600, a best focus condition 602, and an over-focused condition 604. It is noted that by comparing the current focus images 602 (presumed to be initially at a best focus) to periodically acquired under-focused images 600 and over-focused images 604 the controller 110 may determine if the current focus is drifting and whether it is drifting to an under-focused condition or an over-focused condition. In turn, in the event the controller 110 identifies focus drift, the controller 110 may direct the multi-lens assembly 109 to adjust the focus of one of more of the beams 105 to compensate for the identified drift.

Referring again to FIG. 1A, in another embodiment, the program instructions are configured to cause the one or more processors to average one or more images to identify best focus and/or settings to minimize astigmatism.

In one embodiment, the controller 110 may utilize information from multiple sub-images or repeat sub-images to allow focusing on images that are otherwise too noisy for conventional focus algorithms. In one embodiment, the controller 110 may utilize information from multiple sub-images or repeat sub-images to allow focusing on images that have fewer pixels than would normally be required for good focusing.

It is noted that in the case of the multi-beam SEM sub-system 101 the set of focus images can be acquired at a much higher frame rate than that of a single beam SEM. In some cases, this may result in noisier images that are more difficult to focus. However, by averaging focus results across all sub-images (or a sub-set of sub-images) an accurate result can still be obtained. In another embodiment, image frames may be acquired with few numbers of pixels (per sub-image). In this case, the use of multiple channels of the multi-beam SEM sub-system 101 provides for enough pixels and image data for accurate focus determination.

In one embodiment, the SEM sub-system 101 may acquire two or more "repeat" images for each channel defined by the primary beams 105 and signal beams 117. Further, the controller 110 may combine (e.g., average) the multiple repeat images for each channel of the SEM sub-system 101 to form an aggregated image for each of the multiple channels of the SEM sub-system 101. For example, rather than take one slow image that takes 1 second to acquire, 10 fast images, each 1/10 of a second in duration, are acquired and averaged to create a single high-quality image. Based on this averaged image a focus determination may be made.

While much of the present disclosure has focused on focus adjustments of the multi-beam SEM sub-system 101 using multiple images with the multiple beams 105, this should not be interpreted as a limitation on the scope of the present disclosure. Rather, it is contemplated herein that the system 100 may be extended to achieve rapid focus adjustments in a multi-beam sub-system 101 in a variety of ways.

In one embodiment, the system 100 may carry out focus adjustments on the multiple beams 105 of the multi-beam SEM sub-system 101 using one or more line scans. It is noted herein that the various embodiments and components described previously herein with respect to image-based focusing may be extended to any of the embodiments of the present disclosure related to line scanning based focusing.

In one embodiment, the multi-beam SEM sub-system 101 may cause two or more of the electron beams 105 to scan a selected pattern across the sample. Then, the detector assembly 108 may acquire line scan information from each of the corresponding signal beams 117. Based on the signal beams 117 measured by the detector assembly 108, the controller 110 may determine the best focus condition (utilizing any mechanism described previously herein)

The one or more focus targets used to analyze the focus quality of the line scans may be found through any suitable process. In one embodiment, the one or more focus targets are locating using information from a CAD database associated with the sample 107. In another embodiment, the one or more focus targets are located using prior information associated with the stage location during recipe setup. In another embodiment, the one or more focus targets are locating using prior associated information received from an additional tool or system (e.g., additional inspection tool).

In another embodiment, the one or more focus targets may be identified with no prior information. In one embodiment, the electron beams 105 may be scanned in a selected pattern in an effort to locate one or more focus targets. For example, the electron beams 105 may be scanned in a geometric pattern, such as, but not limited to, a set of lines (e.g., parallel lines, crossing lines and etc.). By way of another example, the electron beams 105 may be scanned in a random pattern. It is noted that some topological features (used as focus targets) of the sample 107 will most likely be identified by one or more beams 105 as the beams are scanned across the sample.

In one embodiment, the placement of the line scans may be selected so as to cross one or more features of the sample 107. In this regard, two or more of the beams 105 may intersect at least one edge of the one or more features. For example, the system 100 may acquire line scan information from one or more pre-selected focus targets of the sample 107. For instance, the one or more pre-selected focus targets may be similar features and/or have similar edge slopes. In this regard, two or more beams 105 may scan lines across one or more pre-selected focus targets or at least across one edge of one or more pre-selected focus targets. The detector assembly 108 may then receive the corresponding signal beams and the controller 110 may then measure edge information of the pre-selected focus targets for each of the two or more beams. In turn, based on the line scan information, the controller 110 may determine the best focus condition.

It is noted that by analyzing the sharpness of multiple line scans as the corresponding beams 105 are scanned across the edge of a feature (or similar features) the controller 110 can analyze relative focus of the beams by analyzing the sharpness or abruptness of the line scan signal as it transitions across the feature edge. For instance, an out-of-focus beam may result in a line scan that shows a blurred transition across the edge of a feature, whereby an in-focus beam shows a clearly defined transition across the edge of the feature. Further, the signal slope (as a function of position) of an in-focus beam will be larger than a signal slope for an out-of-focus beam when scanned across the same (or similar features). As such, the controller 110 may identify the best focus condition of the two or more line scans by analyzing the signal slope measured by the detector assembly 108 across one or more features of the sample 107.

Figure 7:
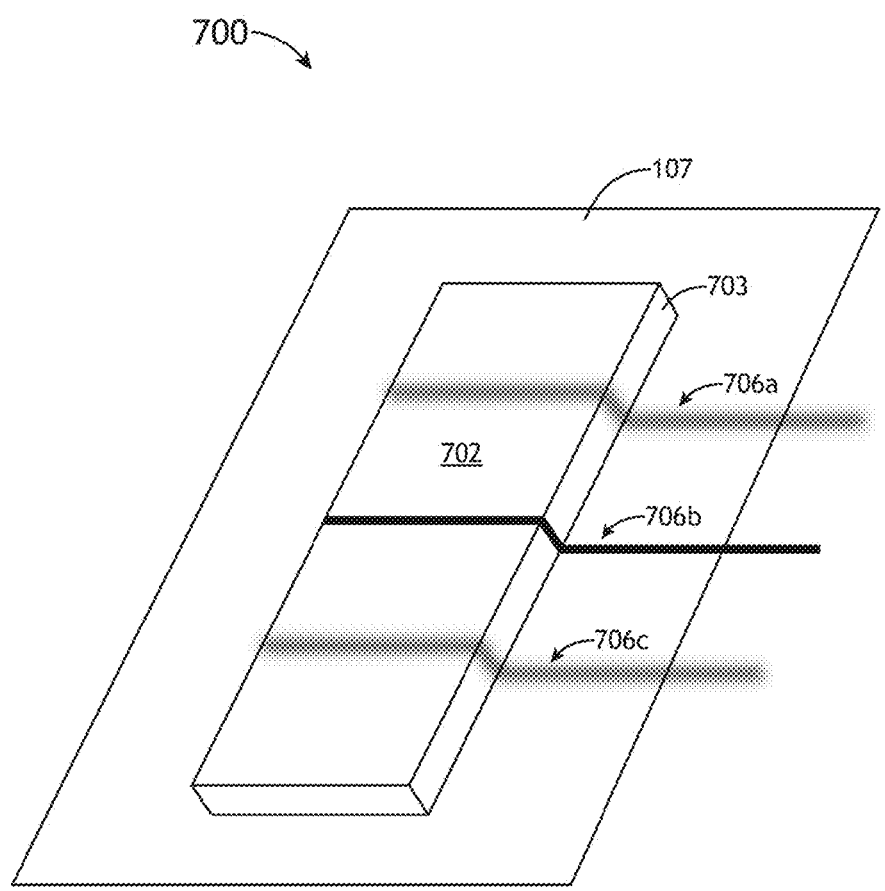
FIG. 7 is conceptual view of a set electron beam lines scans used for rapid focus adjustment of a multi-beam electron beam system, in accordance with one embodiment of the present disclosure.

FIG. 7 depicts a set of under-focused, in-focus and over-focused line scans across an edge 703 of a feature 702 of sample 107. Here, the feature 702 serves as a focus target. As depicted, the under-focused beam 706a and the over-focused beam 706c will be less able to resolve the edge 703 of the feature 702 than the in-focus beam 706b. As a result, the slope of the signal associated with in-focus beam 706b will be greater (i.e., more abrupt change from sample surface to top of feature) than that of the under-focused beam 706a or the over-focused beam 706c. Based on this analysis, the controller 110 may then identify the beam having the greater slope being the beam with the best focus.

In another embodiment, two or more line scans of the same or similar feature may be aligned and then averaged prior to analysis by the controller 110 in order to reduce noise. Such an alignment and averaging scheme may provide for faster focus data acquisition and increase the overall scanning speed of the system 100.

In another embodiment, the focus of one or more electron beams used to perform a line scan may be swept. In this regard, the focus sweeping approached described previously herein may be applied to a line scan context. In another embodiment, the line scan focus sweeping approach described above may be applied to cell-to-cell images using different electron beams 105.

Referring again to FIG. 1A, it is noted herein that the sample stage 106 of the multi-beam SEM sub-system 101 may include any sample stage known in the art suitable for securing the sample 107. The sample 107 may include any sample suitable for inspection/review with electron-beam microscopy, such as, but not limited to, a substrate. The substrate may include, but is not limited to, a silicon wafer. In another embodiment, the sample stage 106 is an actuatable stage. For example, the sample stage 106 may include, but is not limited to, one or more translational stages suitable for selectively translating the sample 107 along one or more linear directions (e.g., x-direction, y-direction and/or z-direction). By way of another example, the sample stage 106 may include, but is not limited to, one or more rotational stages suitable for selectively rotating the sample 107 along a rotational direction. By way of another example, the sample stage 106 may include, but is not limited to, a rotational stage and a translational stage suitable for selectively translating the sample along a linear direction and/or rotating the sample 107 along a rotational direction. It is noted herein that the system 100 may operate in any scanning mode known in the art.

The detector assembly 108 of the multi-beam SEM subsystem 101 may include any detector assembly known in the art suitable for detecting multiple electron signals from the surface of the sample 107. In one embodiment, the detector assembly 108 includes an electron detector array. In this regard, the detector assembly 108 may include an array of electron-detecting portions. Further, each electron-detecting portion of the detector array of the detector assembly 108 may be positioned so as to detect an electron signal from sample 107 associated with one of the incident electron beams 105. In this regard, each channel of the detector assembly 108 corresponds to a particular electron beam of the multiple electron beams 105.

It is noted that the detector assembly 108 may be, but is not limited to, a secondary electron detector or a backscattered electron detector. The detector assembly 108 may include any type of electron detector known in the art. For example, the detector assembly 108 may include a microchannel plate (MCP), a PIN or p-n junction detector array, such as, but not limited to, a diode array or avalanche photo diodes (APDs). By way of another example, the detector assembly 108 may include a high speed scintillator/PMT detector.

The electron-optical assembly 104 may include any electron-optical assembly known in the art suitable for illuminating a sample with multiple electron beams and acquiring multiple images associated with the multiple electron beams. In one embodiment, the electron optical assembly 104 includes a set of electron-optical elements for directing the multiple electron beams 105 onto the surface of the sample 107. The set of electron-optical elements may form an electron-optical column. The set of electron-optical elements of the column may direct at least a portion of the electron beams 105 onto multiple portions of the sample 107. The set of electron-optical elements may include any electron-optical elements known in the art suitable for focusing and/or directing the primary electron beams 105 onto the various areas of the sample 107. In one embodiment, the set of electron-optical elements includes one or more electron-optical lenses. For example, the one or more electron-optical lenses may include, but are not limited to, one or more condenser lenses (e.g., magnetic condenser lens) for collecting electrons from the multi-beam source 103. By way of another example, the electron-optical lenses may include, but are not limited to, one or more objective lenses 114 (e.g., magnetic objective lens) for focusing the primary electron beams 105 onto the various areas of the sample 107.

In another embodiment, the electron optical assembly 104 includes a set of electron-optical elements for collecting electrons (e.g., secondary electrons and/or backscattered electrons) emanating from the sample 107 in response to the multiple primary electron beams 105 and directing and/or focusing those electrons to the detector assembly 108. For example, the electron optical assembly 104 may include, but is not limited to, one or more projection lenses 115 for focusing the multiple electron signal beams 117 to form multiple images of the various portions of the sample 107 at the detector assembly 108.

It is noted that the electron optical assembly 104 of system 100 is not limited to the electron-optical elements depicted in FIG. 1A, which are provided merely for illustrative purposes. It is further noted that the system 100 may include any number and type of electron-optical elements necessary to direct/focus the multiple beams 105 onto the sample 107 and, in response, collect and image the corresponding signal beams 117 onto the detector assembly 108.

For example, the electron-optical assembly 104 may include one or more electron beam scanning elements (not shown). For instance, the one or more electron beam scanning elements may include, but are not limited to, one or more electromagnetic scanning coils or electrostatic deflectors suitable for controlling a position of the beams 105 relative to the surface of the sample 107. Further, the one or more scanning elements may be utilized to scan the electron beams 105 across the sample 107 in a selected pattern.

By way of another example, the electron-optical assembly 104 may include a beam separator (not shown) to separate the multiple electron signals emanating from the surface of the sample 107 from the multiple primary electron beams 105.

The one or more processors 116 of controller 110 may include any processing element known in the art. In this sense, the one or more processors 116 may include any microprocessor-type device configured to execute software algorithms and/or instructions. In one embodiment, the one or more processors 116 may consist of a desktop computer, mainframe computer system, workstation, image computer, parallel processor, or any other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from the non-transitory memory medium 118.

The memory medium 118 may include any storage medium known in the art suitable for storing program instructions executable by the associated one or more processors 116. For example, the memory medium 118 may include a non-transitory memory medium. The memory medium 118 may include, but is not limited to, a read-only memory, a random access memory, a magnetic or optical memory device (e.g., disk), a magnetic tape, a solid state drive and the like. It is noted herein that the memory medium 118 may be configured to store one or more results from the detector assembly 108 and/or the output of one or more of the various steps described herein. It is further noted that memory medium 118 may be housed in a common controller housing with the one or more processors 116. In an alternative embodiment, the memory medium 118 may be located remotely with respect to the physical location of the one or more processors 116. For instance, the one or more processors 116 may access a remote memory (e.g., server), accessible through a network (e.g., internet, intranet and the like).

The embodiments of the system 100 illustrated in FIG. 1 may be further configured as described herein. In addition, the system 100 may be configured to perform any other step(s) of any of the method embodiment(s) described herein.

Figure 8:
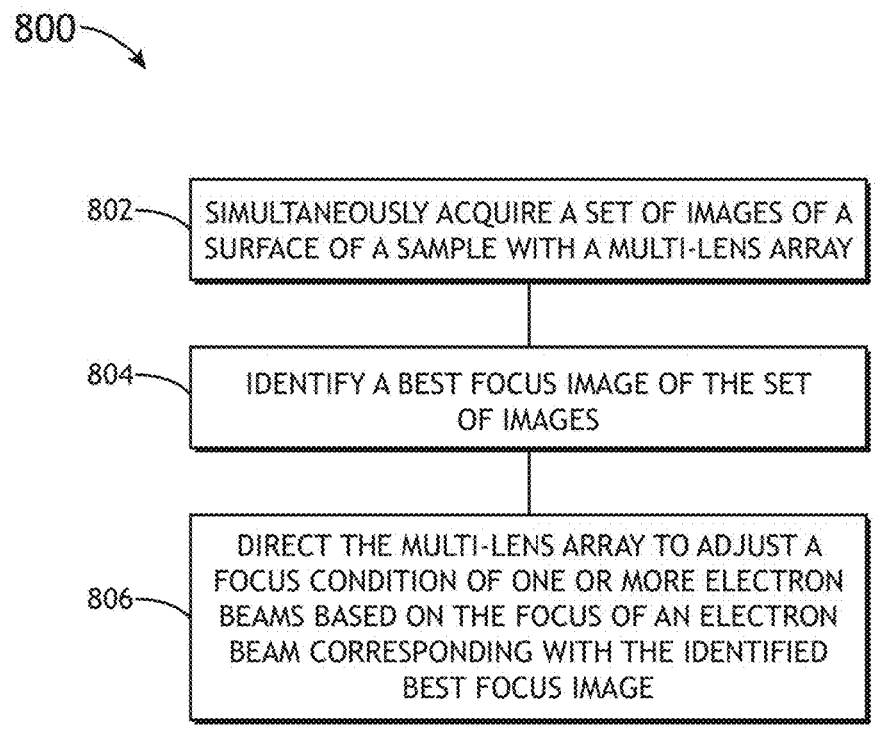
FIG. 8 is a process flow diagram illustrating a method for rapid focus adjustment in a multi-beam SEM system, in accordance with one or more embodiments of the present disclosure.

FIG. 8 is a flow diagram illustrating steps performed in a method 800 of performing a focus adjustment of a multi-beam SEM system, in accordance with one or more embodiments of the present disclosure. It is noted herein that the steps of method 800 may be implemented all or in part by the system 100. It is further recognized, however, that the method 800 is not limited to the system 100 in that additional or alternative system-level embodiments may carry out all or part of the steps of method 800. In step 802, a set of images of a surface of a sample are simultaneously acquired with a multi-lens array. In step 804, a best focus (or best astigmatism) image of the set of images is identified. In step 806, the multi-lens array is directed to adjust a focus condition (or astigmatism condition) of one or more electron beams based on the focus settings of an electron beam corresponding with the identified best focus (or best astigmatism) image.

Figure 9:
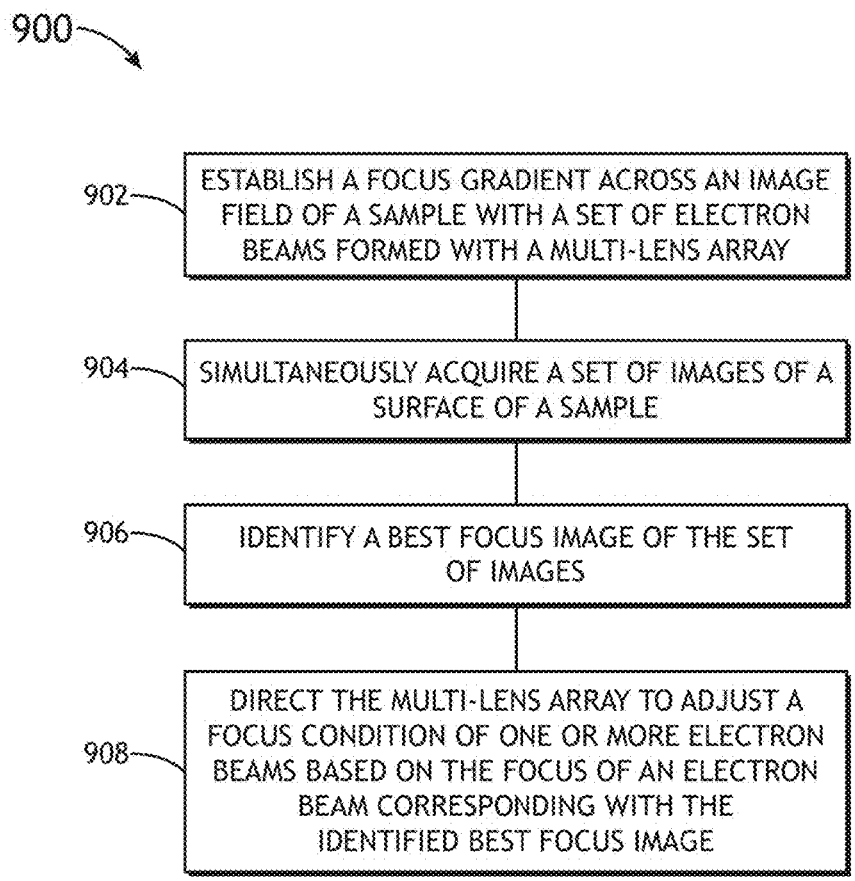
FIG. 9 is a process flow diagram illustrating a method for rapid focus adjustment in a multi-beam SEM system, in accordance with one or more embodiments of the present disclosure.

FIG. 9 is a flow diagram illustrating steps performed in a method 900 of performing a focus adjustment of a multi-beam SEM system through application of a focus gradient, in accordance with one or more embodiments of the present disclosure. It is noted herein that the steps of method 900 may be implemented all or in part by the system 100. It is further recognized, however, that the method 900 is not limited to the system 100 in that additional or alternative system-level embodiments may carry out all or part of the steps of method 900. In step 902, a focus gradient is established across an image field of a sample with a set of electron beams formed with a multi-lens array. In step 904, a set of images of a surface of a sample are simultaneously acquired with a multi-lens array. In step 906, a best focus (or best astigmatism) image of the set of images is identified. In step 908, the multi-lens array is directed to adjust a focus condition (or astigmatism condition) of one or more electron beams based on the focus settings of an electron beam corresponding with the identified best focus image.

Figure 10:
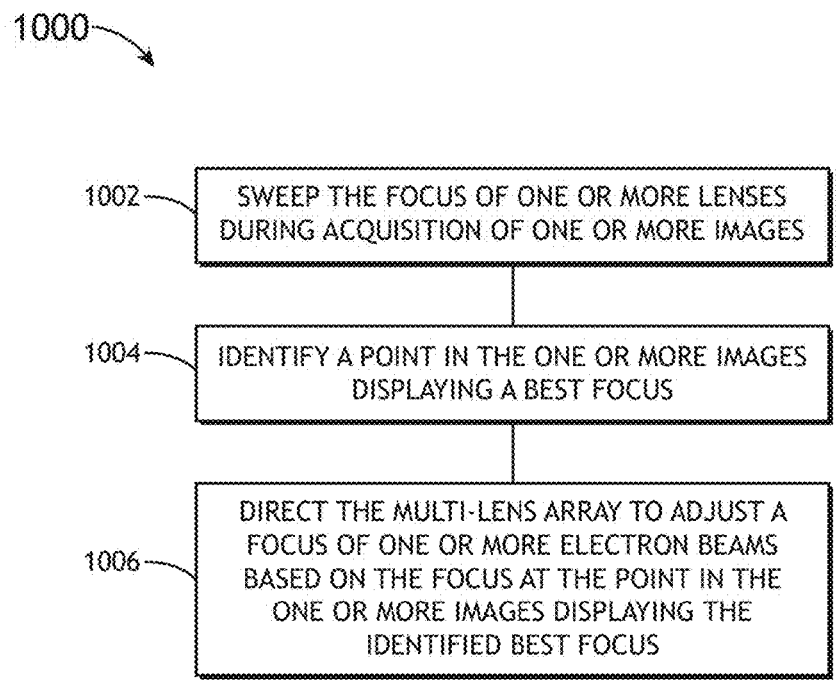
FIG. 10 is a process flow diagram illustrating a method for rapid focus adjustment in a multi-beam SEM system, in accordance with one or more embodiments of the present disclosure.

FIG. 10 is a flow diagram illustrating steps performed in a method 1000 of performing a focus adjustment of a multi-beam SEM system utilizing one or more focus sweeps, in accordance with one or more embodiments of the present disclosure. It is noted herein that the steps of method 1000 may be implemented all or in part by the system 100. It is further recognized, however, that the method 1000 is not limited to the system 100 in that additional or alternative system-level embodiments may carry out all or part of the steps of method 1000. In step 1002, the focus of one or more lenses is swept during acquisition of one or more images. In step 1004, a point in the one or more images displaying a best focus is identified. In step 1006, the multi-lens array is directed to adjust a focus condition of one or more electron beams based on the focus settings of an electron beam at the point in the one or more images displaying the identified best focus.

Figure 11:
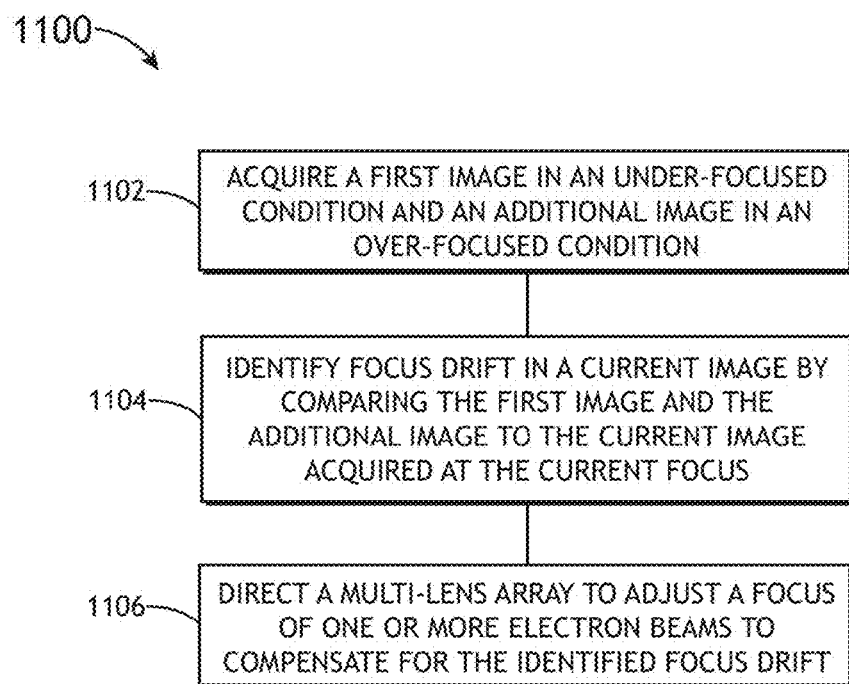
FIG. 11 is a process flow diagram illustrating a method for rapid focus adjustment in a multi-beam SEM system, in accordance with one or more embodiments of the present disclosure.

FIG. 11 is a flow diagram illustrating steps performed in a method 1100 of measuring and compensating for focus drifting in a multi-beam SEM system, in accordance with one or more embodiments of the present disclosure. It is noted herein that the steps of method 1100 may be implemented all or in part by the system 100. It is further recognized, however, that the method 1100 is not limited to the system 100 in that additional or alternative system-level embodiments may carry out all or part of the steps of method 1100. In step 1102, a first image is acquired in an under-focused condition and an additional image is acquired in an over-focused condition. In step 1104, focus drift is identified in a current image by comparing the first image and the additional image to the current image acquired at the current focus. In step 1106, a multi-lens array is directed to adjust a focus of one or more electron beams to compensate for the identified focus drift.

Figure 12:
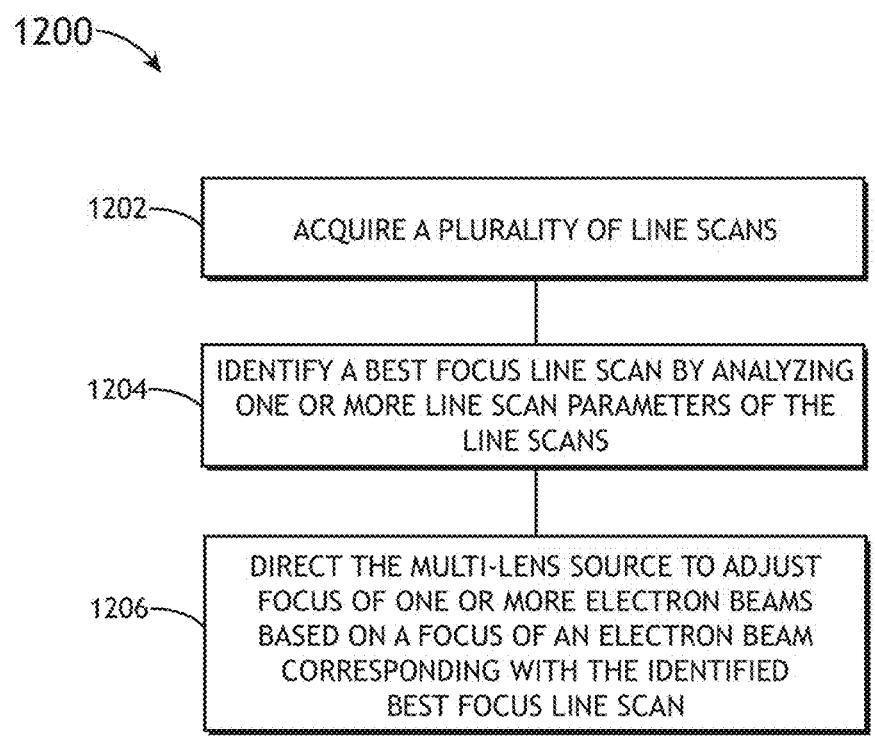
FIG. 12 is a process flow diagram illustrating a method for rapid focus adjustment in a multi-beam SEM system using a set of electron beam line scans, in accordance with one or more embodiments of the present disclosure.

FIG. 12 is a flow diagram illustrating steps performed in a method 1200 of performing a focus adjustment in a multi-beam SEM system, in accordance with one or more embodiments of the present disclosure. It is noted herein that the steps of method 1200 may be implemented all or in part by the system 100. It is further recognized, however, that the method 1200 is not limited to the system 100 in that additional or alternative system-level embodiments may carry out all or part of the steps of method 1200. In step 1202, a set of line scans are acquired. In step 1204, a best focus (or best astigmatism) line scan is identified by analyzing one or more line scan parameters (e.g., signal slope) of the line scans. In step 1206, the multi-lens array is directed to adjust a focus condition (or astigmatism condition) of one or more electron beams based on the focus settings of an electron beam corresponding with the identified best focus (or best astigmatism) line scan.

All of the methods described herein may include storing results of one or more steps of the method embodiments in the memory medium 118. The results may include any of the results described herein and may be stored in any manner known in the art. After the results have been stored, the results can be accessed in the memory medium and used by any of the method or system embodiments described herein, formatted for display to a user via user interface 119, used by another software module, method, or system, etc. Furthermore, the results may be stored "permanently," "semi-permanently," temporarily, or for some period of time.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A multi-beam scanning electron microscopy apparatus comprising:
    a multi-beam scanning electron microscopy sub-system comprising:
        a multi-beam electron beam source including an electron gun configured to generate an illumination beam and a multi-lens array assembly configured to split the illumination beam into the plurality of electron beams, wherein the multi-lens array assembly is configured for adjusting focus of one or more lenses of the lens array assembly;
        a sample stage configured to secure a sample;
        an electron-optical assembly including a set of electron-optical elements configured to direct at least a portion of the plurality of electron beams onto a portion of the sample; and
        a detector assembly configured to simultaneously acquire a plurality of images of the surface of the sample, each image associated with an electron beam of the plurality of electron beams;
    a controller including one or more processors configured to execute a set of program instructions stored in memory for causing the one or more processors to:
        direct the multi-lens array assembly to establish a selected focus gradient across an image field of the sample to find a best focus configuration, wherein one or more features of the sample within the image field serve as one or more focus targets, wherein two or more lenses of the multi-lens array focus two or more electron beams of the plurality of electron beams to different foci on the one or more features of the sample;
        receive the plurality of images from the detector assembly, wherein at least some of the images have a different focus;
        identify the best focus configuration based on the received plurality of images; and
        direct the multi-lens array assembly to adjust a focus of one or more electron beams based on the focus of an electron beam corresponding with the identified best focus image.

2. The apparatus of claim 1, wherein the controller is configured to identify a best focus image of the plurality of images by analyzing one or more image quality parameters of at least some of the images of the plurality of the images.

3. The apparatus of claim 1, wherein the one or more image quality parameters comprise:
    image sharpness.

4. The apparatus of claim 1, wherein the multi-lens array assembly comprises:
    a set of lenses distributed across an array plate.

5. The apparatus of claim 1, wherein the multi-lens array is configured to adjust the voltage on one or more of the sets of lenses to establish a focus gradient across an image field of the sample.

6. The apparatus of claim 1, wherein the multi-lens array assembly is configured to adjust the separation between one or more plates of one or more lenses of the set of lenses to establish a focus gradient across an image field of the sample.

7. The apparatus of claim 1, wherein the multi-lens array assembly is configured to adjust the tilt of the array plate to establish a focus gradient across an image field of the sample.

8. The apparatus of claim 1, wherein the focus gradient is temporary.

9. The apparatus of claim 1, wherein the set of electron-optical elements comprise:
    at least one of a condenser lens or objective lens.

10. The apparatus of claim 1, wherein the detector assembly comprises:
    a detector array.

11. The apparatus of claim 1, wherein the detector assembly comprises:
    one or more secondary electron detectors.

12. The apparatus of claim 1, wherein the detector assembly comprises:
    one or more backscattered electron detectors.

13. A multi-beam scanning electron microscopy apparatus comprising:
    a multi-beam scanning electron microscopy sub-system comprising:
        a multi-beam electron beam source including an electron gun configured to generate an illumination beam and a multi-lens array assembly configured to split the illumination beam into the plurality of electron beams, wherein the multi-lens array assembly is configured for adjusting astigmatism of one or more lenses of the lens array assembly;
        a sample stage configured to secure a sample;
        an electron-optical assembly including a set of electron-optical elements configured to direct at least a portion of the plurality of electron beams onto a portion of the sample; and
        a detector assembly configured to simultaneously acquire a plurality of images of the surface of the sample, each image associated with an electron beam of the plurality of electron beams;
    a controller including one or more processors configured to execute a set of program instructions stored in memory for causing the one or more processors to:
        direct the multi-lens array assembly to establish a selected astigmatism gradient across an image field of the sample to find a best astigmatism configuration, wherein two or more lenses of the multi-lens array focus two or more electron beams of the plurality of electron beams to so as to display different amounts of astigmatism;
        receive the plurality of images from the detector assembly, wherein at least some of the images have different amounts of astigmatism;

identify the best astigmatism configuration based on the received plurality of images; and direct the multi-lens array assembly to adjust astigmatism of one or more electron beams based on a lens condition of an electron beam corresponding with the identified best astigmatism image.

14. A multi-beam scanning electron microscopy apparatus comprising:

a multi-beam scanning electron microscopy sub-system comprising:
- a multi-beam electron beam source including an electron gun configured to generate an illumination beam and a multi-lens array assembly configured to split the illumination beam into the plurality of electron beams, wherein the multi-lens array assembly is configured for adjusting focus of one or more lenses of the lens array assembly;
- a sample stage configured to secure a sample;
- an electron-optical assembly including a set of electron-optical elements configured to direct at least a portion of the plurality of electron beams onto a portion of the sample; and
- a detector assembly configured to simultaneously acquire a plurality of images of the surface of the sample, each image associated with an electron beam of the plurality of electron beams;

a controller including one or more processors configured to execute a set of program instructions stored in memory for causing the one or more processors to:
- direct the multi-lens array assembly to sweep at least one of the focus or astigmatism of one or more lenses during acquisition of one or more images corresponding with the one or more lenses to find at least one of a best focus configuration or a best astigmatism configuration, wherein the one or more images include an image of one or more features of the sample, wherein the one or more features serve as one or more focus targets;
- receive the one or more images from the detector assembly, wherein the one or more images;
- identify a point in the one or more images displaying at least one of best focus or best astigmatism by analyzing one or more image quality parameters across the one or more images; and
- direct the multi-lens array to adjust at least one of focus of one or more electron beams or astigmatism of the one or more electron beams based on at least one of the focus or astigmatism at the point in the one or more images displaying at least one of the identified best focus or the identified best astigmatism.

* * * * *